United States Patent [19]
Chang

[11] Patent Number: 5,807,786
[45] Date of Patent: Sep. 15, 1998

[54] METHOD OF MAKING A BARRIER LAYER TO PROTECT PROGRAMMABLE ANTIFUSE STRUCTURE FROM DAMAGE DURING FABRICATION SEQUENCE

[75] Inventor: Tzong-Sheng Chang, Chang-Hua, Taiwan

[73] Assignee: Taiwan Semiconductor Manufacturing Company, Ltd., Hsin-Chu, Taiwan

[21] Appl. No.: 902,754

[22] Filed: Jul. 30, 1997

[51] Int. Cl.⁶ ............................................. H01L 21/44
[52] U.S. Cl. ..................... 438/600; 438/131; 438/467; 257/50; 257/530
[58] Field of Search .................................. 438/600, 131, 438/467, 672; 257/50, 530

[56] References Cited

U.S. PATENT DOCUMENTS

| | | | |
|---|---|---|---|
| 4,751,197 | 6/1988 | Wills | 438/600 |
| 5,181,096 | 1/1993 | Forouhi | 257/530 |
| 5,254,498 | 10/1993 | Sumi | 438/672 |
| 5,300,456 | 4/1994 | Tigelaar et al. | 438/600 |
| 5,308,795 | 5/1994 | Hawley et al. | 438/600 |
| 5,381,035 | 1/1995 | Chen et al. | 257/530 |
| 5,387,311 | 2/1995 | Hall et al. | 438/600 |
| 5,387,550 | 2/1995 | Cheffings et al. | 438/672 |
| 5,471,154 | 11/1995 | Gordon et al. | 438/467 |
| 5,496,773 | 3/1996 | Rhodes et al. | 438/672 |
| 5,508,220 | 4/1996 | Eltoukhy et al. | 438/600 |
| 5,602,053 | 2/1997 | Zheng et al. | 438/600 |
| 5,614,756 | 3/1997 | Forouhi et al. | 257/530 |
| 5,639,684 | 6/1997 | Kwik | 438/600 |
| 5,747,379 | 5/1998 | Huang et al. | 438/672 |

*Primary Examiner*—John Niebling
*Assistant Examiner*—Lynne A. Gurley
*Attorney, Agent, or Firm*—George O. Saile; Stephen B. Ackerman

[57] ABSTRACT

A method for forming an antifuse interconnect structure, for a one-time fusible link, to be used with field-programmable gate arrays, has been developed. The process features the use of an amorphous silicon layer, used as the antifuse layer, with the amorphous silicon layer protected by a thin barrier layer, during the patterning procedure. The protected antifuse layer results in a reproducible thickness, and thus reproducible pulsing voltages, needed for rupturing of the antifuse layer. Planarization of an underlying metal plug, via an insulator refill procedure, offers a smooth surface for the overlying antifuse layer.

27 Claims, 3 Drawing Sheets

METHOD OF MAKING A BARRIER LAYER TO PROTECT PROGRAMMABLE ANTIFUSE STRUCTURE FROM DAMAGE DURING FABRICATION SEQUENCE

BACKGROUND OF THE INVENTION (1) Field of the Invention

The present invention relates to methods used to fabricate semiconductor devices, and more specifically to a process for creating antifuse-based, programmable interconnect links, for field programmable gate arrays, (FPGA).

(2) Description of Prior Art

Field-programmable gate arrays, (FPGA), have been designed to contain the needed row of arrays, as well as additional rows of spare arrays, accessed if needed to replace ineffective counterparts, or to modify a specific design. Recent FPGA designs, feature one-time fusible link structures as possible programmable low resistance interconnect links, if accessed. These additional or spare arrays, or one-time fusible link structures, are sometimes comprised of an antifuse based programmable interconnect structure. The structure consists of an antifuse layer, usually a thin dielectric layer, placed between electrodes or conductive materials. When needed this antifuse material can be ruptured, or converted to a lower resistance layer, via a high voltage electrical pulse, resulting in creation of the replacement array structure.

The antifuse layer, used with the one-time fusible link structure, can be a dielectric layer, such as silicon oxide or silicon nitride. However to perform as an antifuse layer, the dielectric layer has to be thin, to allow reasonable programmable voltages to be successfully used. Thus small increases in the thickness of the thin antifuse dielectric layer, due to uniformities in the dielectric layer deposition procedure, may result in inadequate programmed links. Forouhi, in U.S. Pat. No. 5,181,096, has suggested the use of an amorphous silicon layer, as a part of a composite antifuse layer, sandwiching the amorphous silicon layer with dielectric layers. This invention will describe a simpler process for forming one-time fusible link structures, using only an amorphous silicon layer as the antifuse layer. However to avoid contamination, and additional oxide growth, on the amorphous silicon layer, during patterning procedures, a thin conductive barrier layer is used to overlie, and protect, the amorphous silicon antifuse layer, during specific fabrication sequences.

SUMMARY OF THE INVENTION

It is an object of this invention to provide a structure offering a one-time fusible link, for field programmable gate array designs.

It is another object of this invention to use an antifuse based interconnect, featuring an amorphous silicon, antifuse layer, for the one-time fusible link structure.

It is yet another object of this invention to form the antifuse layer in a composite layer of titanium nitride on amorphous silicon, where the overlying titanium nitride layer protects the underlying amorphous silicon layer from subsequent processing procedures.

In accordance with the present invention a process for forming an antifuse based interconnect structure, to be used for a one-time fusible link, is described. A semiconductor substrate, comprised of overlying metal interconnect patterns, contacting conductive regions in the semiconductor substrate, is provided. A first metal interconnect structure, to be used as the lower electrode of the antifuse based interconnect structure, is formed, contacting conductive regions in the semiconductor substrate. An interlevel dielectric layer is deposited, followed by a chemical mechanical polishing procedure, used for planarization purposes. A via hole opening is creating in the interlevel dielectric layer, exposing the top surface of the first metal interconnect structure. A thin barrier layer is next deposited, coating the exposed surfaces of the via hole opening, followed by the deposition of a metal layer, completely filling the via hole opening. A dry etching procedure is next used to remove unwanted metal from the top surface of the interlevel dielectric layer, forming a metal plug in the via hole opening. A deposition of an insulator layer, followed by another chemical mechanical polishing procedure, removes the insulator layer from the top surface of the interlevel dielectric layer, and from the top surface of the metal plug, filling recesses in the metal plug, recesses that were created during the metal etch back procedure. An amorphous silicon, antifuse layer, is next deposited, followed by the deposition of a thin titanium nitride layer. Patterning, using photolithographic and dry etching procedures, is used to form the composite antifuse layer, overlying the metal plug. A second metal interconnect structure, to be used as the upper electrode of the antifuse based interconnect structure, is formed overlying the composite antifuse layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for forming an antifuse based interconnect structure, to be used for a one-time fusible link, will now be described in detail. This structure is formed on a semiconductor substrate, comprised of N type and P type conductive regions, in the semiconductor substrate, with overlying metal and insulator patterns, used for wiring purposes. The antifuse based interconnect structure will be fabricated on the integrated wiring patterns present on the semiconductor substrate. The specific conductive regions in the semiconductor substrate, and the overlying wiring patterns, can be formed to achieve complimentary metal oxide semiconductor field effect transistor, (CMOS), designs, or BiCMOS designs, used for desired memory applications.

Figure 1:
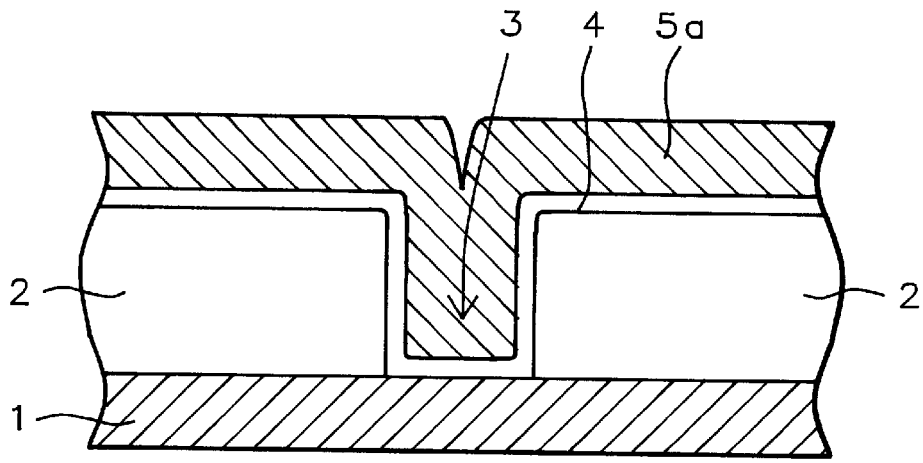
FIGS. 1–6, which schematically, in cross-sectional style, show the stages of fabrication used to form the one-time fusible link, using an antifuse based interconnect structure.

FIG. 1, schematically shows a first interconnect structure, 1, formed on an underlying semiconductor substrate, (not shown), with the first interconnect structure 1, either contacting a conductive region of the underlying semiconductor substrate, or contacting a wiring level, that in turn contacts a conductive region in the semiconductor substrate. First interconnect structure 1, is created by initially depositing a layer of an aluminum based metallization, such as pure aluminum, or aluminum, with between about 0 to 3% copper, or aluminum with between about 0 to 3% copper, and with between about 0 to 1% silicon. The aluminum based metallization is deposited using r.f sputtering, to a thickness between about 3000 to 5000 Angstroms. A layer of titanium nitride is also deposited, via r.f. sputtering, to a thickness between about 1200 to 1600 Angstroms, overlying the aluminum based layer. The metallization used for the first interconnect structure can also be tungsten or tungsten silicide. Patterning of the metal layer is performed using conventional photolithographic and anisotropic reactive ion etching procedures, using $Cl_2$ as an etchant, creating first interconnect structure 1, used as the lower electrode of the antifuse based interconnect structure.

An interlevel dielectric layer 2, comprised of silicon oxide, is next deposited using plasma enhanced chemical vapor deposition, (PECVD), to a thickness between about 2.2 to 2.6 uM. A chemical mechanical polishing, (CMP), procedure is then employed to create a smooth top surface topography for interlevel dielectric layer 2. The CMP procedure removes between about 8000 to 12000 Angstroms of interlevel dielectric layer 2. This is shown schematically in FIG. 1. Conventional photolithographic and anisotropic RIE procedures, using $CHF_3$ as an etchant, are used to open via hole 3, in interlevel dielectric layer 2. Via hole 3, with a diameter between about 0.4 to 0.6 uM, results in the exposure of the top surface of first interconnect structure 1. A barrier layer of titanium nitride 4, is next deposited using r.f. sputtering procedures, to a thickness between 800 to 1200 Angstroms, coating the exposed surfaces of via hole 3. A tungsten layer 5a, is then deposited, via low pressure chemical vapor deposition, (LPCVD), procedures, to a thickness between about 4000 to 6000 Angstroms, completely filling via hole 3. This is schematically shown in FIG. 1.

Figure 2:
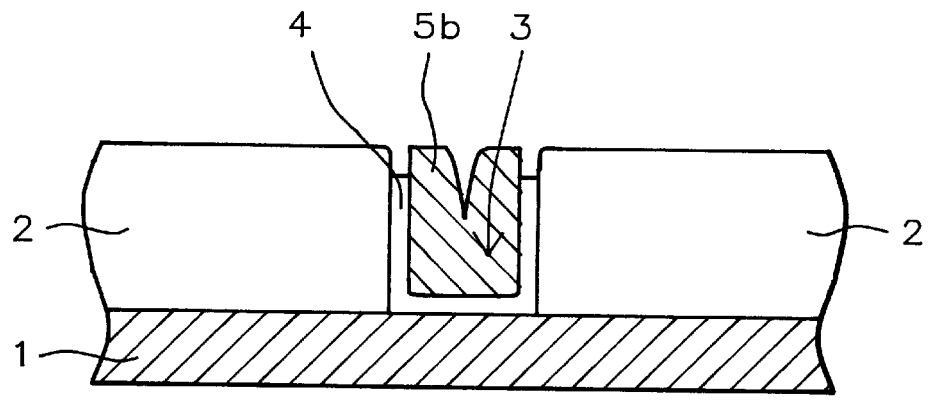
Figure 3:
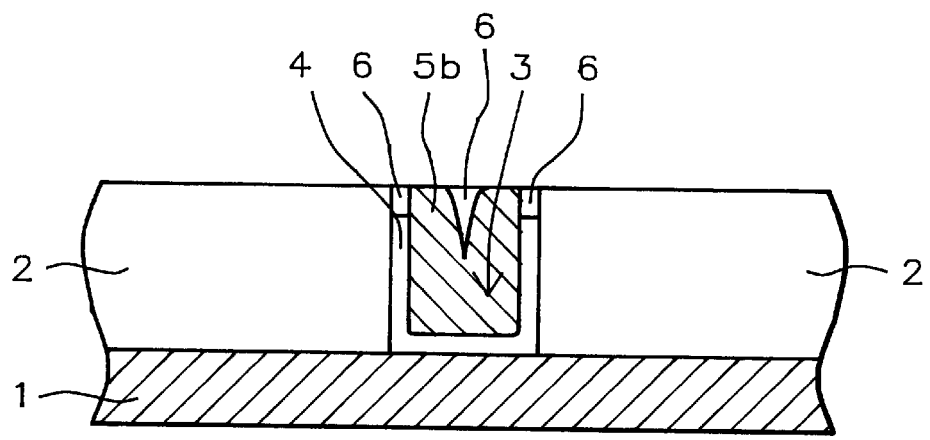

Unwanted regions of tungsten layer 5a, as well as unwanted regions of titanium nitride layer 4, are next removed via an anisotropic RIE, etch back procedure, using either $CF_4$-$O_2$, $NF_3$-$O_2$, or $SF_6$-$O_2$, as an etchant. The etch back procedure removes unwanted material from the top surface of interlevel dielectric layer 2, creating tungsten plug 5b, and tungsten nitride spacers 4, in via hole 3. However an over etch cycle, used to remove any residual metal, that can be present due to deposition variations, results in the recessing of the titanium nitride spacers 4, in via hole 3. The same over etch cycle also transfers a seam, in the center of the tungsten layer 5a, to the tungsten plug 5b, in via hole 3. This is shown schematically in FIG. 2. This recess and seam, if left untreated would adversely influence the subsequent overlying antifuse layer, via creation of rails, in the recesses. Therefore a layer of silicon oxide is deposited using PECVD procedures, to a thickness between about 800 to 1200 Angstroms, followed by another CMP procedure, resulting in the filling of the recessed regions with silicon oxide fills 6, resulting in a smooth top surface topography of the tungsten plug 5b. This is shown schematically in FIG. 3.

Figure 4:
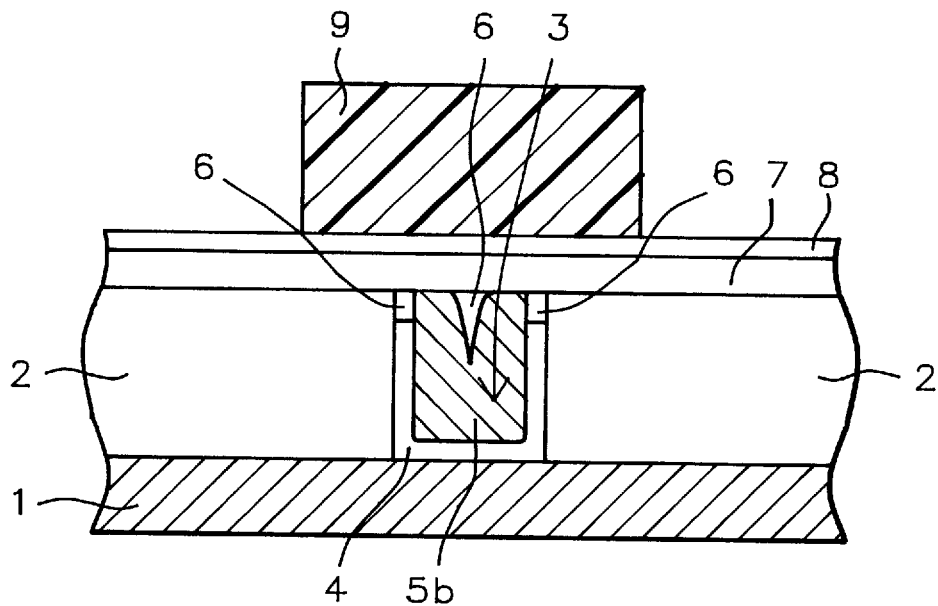

FIG. 4, schematically shows the result of depositing the composite antifuse layer. A layer of amorphous silicon 7, is deposited using PECVD procedures, at a temperature between about 350° to 450° C., to a thickness between about 800 to 1200 Angstroms. Amorphous silicon layer 7, will be the layer ruptured, via high voltage pulsing, to form a conductive link between underlying first interconnect structure 1, and a subsequent, overlying second interconnect structure, if desired. Therefore the thickness of the antifuse layer is critical in choosing the correct pulsing voltage. If patterning of amorphous silicon layer 7, were performed using conventional photolithographic procedures, the photoresist removal procedure can result in unwanted growth of oxide during the oxygen ashing process, resulting in possible pulsing voltage uncertainties. Therefore to protect the critical antifuse layer from direct exposure to photolithographic procedures, an overlying layer of titanium nitride 8, is deposited, using r.f. sputtering procedures, to a thickness between about 200 to 300 Angstroms. A layer of titanium—tungsten can be employed in place of titanium nitride, if desired. Photoresist shape 9, schematically shown in FIG. 4, now interfaces titanium nitride layer 8, not amorphous silicon layer 7. If desired the antifuse layer can be comprised of titanium oxide, oxidized nitride, (ON), or oxidized nitride—oxide, (ONO), again protected during subsequent processing by a thin overlying barrier layer, such as titanium nitride.

Figure 5:
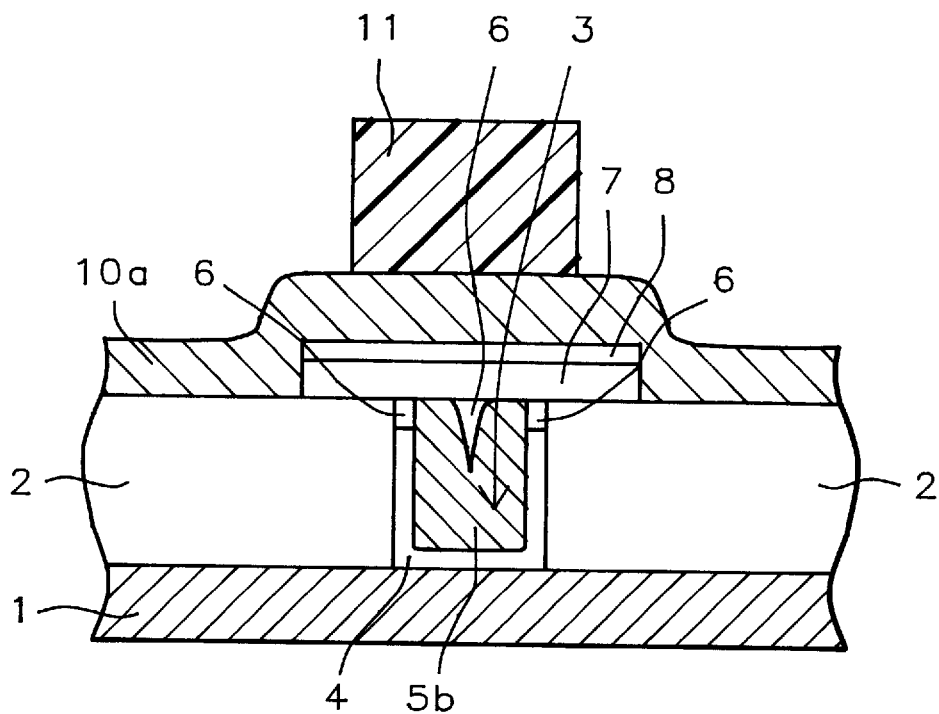

Patterning of titanium nitride layer 8, and amorphous silicon layer 7, is accomplished via anisotropic RIE procedures, using $Cl_2$ as an etchant, and using photoresist shape 9, as a mask, resulting in the composite antifuse shape, with a diameter between about 0.7 to 0.9 uM, directly overlying tungsten plug 5b. This is schematically shown in FIG. 5. Removal of photoresist shape 9, via oxygen ashing and wet clean procedures, is next performed, exposing titanium nitride layer 8, overlying the protected, critical amorphous silicon layer 7. A metal layer 10a, needed for a second interconnect structure, or the upper electrode of the antifuse interconnect structure, is next deposited. Metal layer 10a, deposited using r.f. sputtering procedures, is comprised of an aluminum based layer, that can contain copper and silicon, at a thickness between about 6000 to 10000 Angstroms. The aluminum based layer is placed between an underlying layer of titanium nitride, at a thickness between about 500 to 1000 Angstroms, and an overlying layer of titanium nitride, at a thickness between about 200 to 300 Angstroms. Photoresist shape 11, to be used as a mask for the creation of the second interconnect structure, is also shown schematically in FIG. 5.

Figure 6:
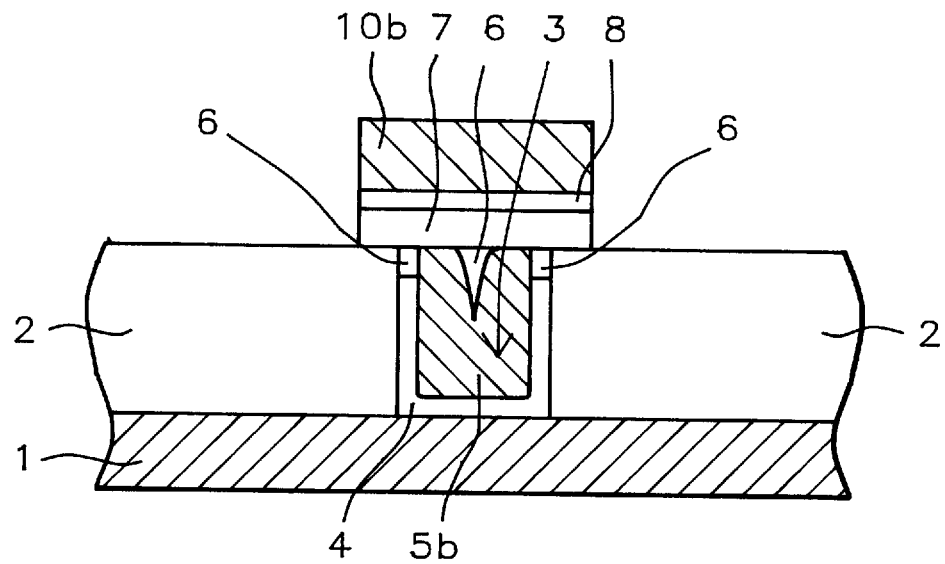
Figure 7:
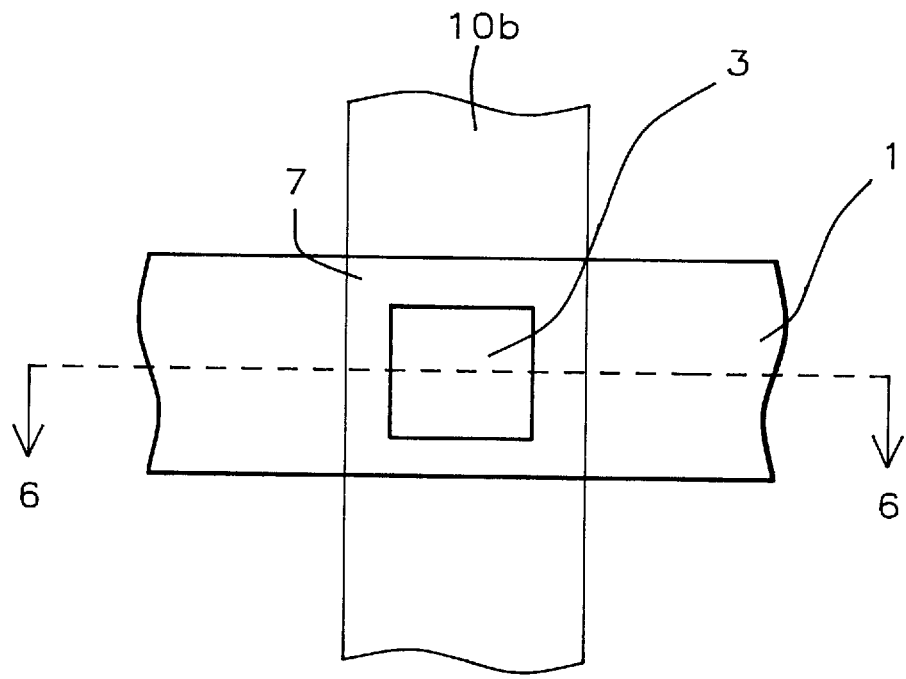
FIG. 7, which shows a top view of the antifuse based interconnect structure.

Anisotropic RIE is used to create second interconnect structure 10b, as well as the shapes for the comprised antifuse layers of titanium nitride 8, and amorphous silicon 7, using $CF_4$ or $CHF_3$ as an etchant for these materials. The width of second interconnect structure 10b, is between about 0.7 to 0.9 uM. Photoresist shape 11, is again removed via oxygen plasma ashing and wet cleans, resulting in the antifuse interconnect structure featuring an amorphous silicon antifuse layer, placed between conductive electrodes. This is schematically shown in FIG. 6. A top view of the antifuse interconnect structure, cross-sectional shown in FIG. 6, is presented in FIG. 7.

While this invention has been particularly shown and described with reference to the preferred embodiments thereof, it will be understood by those skilled in the art that various changes in form and details may be made without departing from the spirit and scope of this invention.

What is claimed is:

1. A method of forming an antifuse based interconnect structure, comprising the steps of:

providing active elements in a semiconductor substrate;

forming a first interconnect structure, contacting said active elements, in said semiconductor substrate;

depositing an insulator layer, on said first interconnect structure;

forming a via hole in said insulator layer, exposing top surface of said first interconnect structure;

forming sidewall spacers, on the inside surfaces of said via hole, and forming a metal plug in said via hole;

insulator filling of recesses, in said metal plug, and in said sidewall spacers;

forming an antifuse layer, contacting said metal plug; and forming a second interconnect structure, contacting said antifuse layer.

2. The method of claim 1, wherein said active elements in said semiconductor substrate, are MOSFET devices, configured in a gate array pattern.

3. The method of claim 1, wherein said first interconnect structure is formed from an underlying aluminum based layer, containing between about 0 to 3% copper, and between about 0 to 1% silicon, at a thickness between about 3000 to 5000 Angstroms, and an overlying titanium nitride layer, at a thickness between about 1200 to 1600 Angstroms.

4. The method of claim 1, wherein said first interconnect structure can be formed from a material selected from the group of tungsten, titanium-tungsten, or tungsten silicide.

5. The method of claim 1, wherein said insulator layer is silicon oxide, deposited using PECVD procedures, at a thickness between about 2.2 to 2.6 uM, and planarized using CMP procedures, to create a final thickness, for said insulator layer, between about 1.2 to 1.6 uM.

6. The method of claim 1, wherein said via hole, in said insulator layer, is formed via anisotropic RIE, using $CHF_3$ as an etchant, with said via hole having a diameter between about 0.4 to 0.6 uM.

7. The method of claim 1, wherein said sidewall spacers, in via hole, are formed from a titanium nitride layer, deposited to a thickness between about 800 to 1200 Angstroms, and said metal plug is formed from a tungsten layer, obtained via LPCVD deposition at a thickness between about 4000 to 6000 Angstroms.

8. The method of claim 1, wherein said metal plug, in said via hole, and said sidewall spacers, are formed by anisotropic RIE etch back procedures, using either $CF_4$—$O_2$, $NF_3$—$O_2$, or $SF_6$—$O_2$ as an etchant.

9. The method of claim 1, wherein recesses, in said metal plug, and in said sidewall spacers, are repaired by filling with a silicon oxide layer, via PECVD procedures, to a thickness between about 800 to 1200 Angstroms, followed by a CMP procedure.

10. The method of claim 1, wherein said antifuse layer, is a composite layer, comprised of an underlying amorphous silicon layer, deposited using PECVD procedures, at a temperature between about 350° to 450° C., to a thickness between about 800 to 1200 Angstroms, and an overlying layer of titanium nitride, at a thickness between about 200 to 300 Angstroms.

11. The method of claim 1, wherein said antifuse layer can be selected from a group of materials that include titanium oxide, oxidized nitride, (ON), or oxidized nitride-oxide, (ONO), all protected with an overlying layer of titanium nitride.

12. The method of claim 1, wherein said antifuse layer is patterned using photolithographic and anisotropic RIE procedures, using $Cl_2$ as an etchant.

13. The method of claim 1, wherein said second interconnect structure is formed from an aluminum based layer, containing copper, silicon, titanium nitride, or titanium-tungsten.

14. A method for forming an antifuse based interconnect structure, with the antifuse layer shape formed from a titanium nitride layer, overlying an amorphous silicon layer, comprising the steps of:

providing active elements in a semiconductor substrate;

forming a first interconnect structure contacting said active elements, in said semiconductor substrate;

depositing a first insulator layer;

planarizing said first insulator layer;

opening a via hole in said first insulator layer, exposing top surface of said first interconnect structure;

depositing a first titanium nitride layer, coating the sides of said via hole;

depositing a tungsten layer, completely filling said via hole;

removing said first titanium nitride layer, and said tungsten layer, from top surface of said first insulator layer, forming titanium nitride spacers, on sides of said via hole, and forming a tungsten plug, in said via hole, while also recessing said titanium nitride spacers, on the sides of said via hole;

depositing a second insulator layer, filling recesses in said titanium nitride spacers;

removing said second insulator layer from all regions, except from recesses in said titanium nitride spacers, creating insulator spacer fills;

depositing an amorphous silicon layer;

depositing a second titanium nitride layer, on said amorphous silicon layer;

patterning of said second titanium nitride layer, and of said amorphous silicon layer, to form said antifuse layer shape, comprised of said second titanium nitride layer, overlying said amorphous silicon layer; and forming a second interconnect structure, contacting underlying, said antifuse layer shape.

15. The method of claim 14, wherein said active elements in said semiconductor substrate are MOSFET devices, configured in a gate array pattern.

16. The method of claim 14, wherein said first interconnect structure is formed from an underlying aluminum based layer, containing between about 0 to 3% copper, and between about 0 to 1% silicon, at a thickness between about 3000 to 5000 Angstroms, and an overlying titanium nitride layer, at a thickness between about 1200 to 1600 Angstroms.

17. The method of claim 14, wherein said first insulator layer is silicon oxide, deposited using PECVD procedures, to a thickness between about 2.2 to 2.6 uM.

18. The method of claim 14, wherein said first insulator layer is planarized using CMP procedures, reducing said first insulator thickness to between about 1.2 to 1.6 uM.

19. The method of claim 14, wherein said via hole is formed in said first insulator layer, via anisotropic RIE procedures, using $CHF_3$ as an etchant.

20. The method of claim 14, wherein said first titanium nitride layer is deposited using r.f. sputtering, to a thickness between about 800 to 1200 Angstroms.

21. The method of claim 14, wherein said tungsten layer is deposited using LPCVD procedures, at a thickness between about 4000 to 6000 Angstroms.

22. The method of claim 14, wherein said titanium nitride spacers, and said tungsten plug, are formed in said via hole, via anisotropic RIE procedures, using $Cl_2$ as an etchant.

23. The method of claim 14, wherein recesses in said titanium nitride spacers, are filled with said insulator spacer fills, via deposition of said second insulator layer, at a thickness between about 800 to 1200 Angstroms, via PECVD procedures, followed by a planarizing CMP procedure.

24. The method of claim 14, wherein said amorphous silicon layer is deposited using LPCVD procedures, at a temperature between about 350° to 450° C., to a thickness between about 800 to 1200 Angstroms.

25. The method of claim 14, wherein said second titanium nitride layer is deposited using r.f. sputtering, to a thickness between about 200 to 300 Angstroms.

26. The method of claim 14, wherein said antifuse layer shape is formed via anisotropic RIE of said second titanium nitride layer, and of said amorphous silicon layer, using $Cl_2$ as an etchant.

27. The method of claim 14, wherein said second interconnect structure is formed from an aluminum based layer, that can contain copper, silicon, titanium nitride, or titanium-tungsten.

* * * * *